United States Patent
Cossins et al.

[11] Patent Number: 6,111,514
[45] Date of Patent: Aug. 29, 2000

[54] SOLENOID FAIL-SAFE USING CURRENT FEEDBACK AS A DIAGNOSTIC INPUT

[75] Inventors: James M. Cossins, Taylor; Mark C. Pinkowski, Livonia, both of Mich.

[73] Assignee: Kelsey-Hayes Company, Livonia, Mich.

[21] Appl. No.: 08/993,265

[22] Filed: Dec. 18, 1997

Related U.S. Application Data

[60] Provisional application No. 60/033,197, Dec. 18, 1996.

[51] Int. Cl.[7] .................................................. G08B 21/00
[52] U.S. Cl. ............................................ 340/654; 340/657
[58] Field of Search ................................. 340/654, 664, 340/657; 303/122.12; 361/31, 92; 73/121

[56] References Cited

U.S. PATENT DOCUMENTS

| | | | |
|---|---|---|---|
| 4,205,307 | 5/1980 | Liermann et al. ........................ | 340/644 |
| 4,472,778 | 9/1984 | Davis ........................................ | 364/426 |
| 4,558,310 | 12/1985 | McAllise ................................... | 340/661 |
| 4,583,086 | 4/1986 | Andrews et al. ......................... | 340/640 |
| 4,964,014 | 10/1990 | Boe et al. ................................. | 361/187 |
| 5,170,343 | 12/1992 | Matsuda ................................... | 364/184 |
| 5,453,821 | 9/1995 | Howes, Jr. et al. ..................... | 335/263 |
| 5,583,434 | 12/1996 | Moyers et al. ...................... | 324/207.16 |
| 5,650,909 | 7/1997 | Remele et al. ........................... | 361/154 |
| 5,779,327 | 7/1998 | Nakashima et al. ............... | 303/122.12 |

Primary Examiner—Jeffery A. Hofsass
Assistant Examiner—Anh V. La
Attorney, Agent, or Firm—MacMillan, Sobanski & Todd, LLC

[57] ABSTRACT

The current through the coil of a solenoid valve is monitored for a deflection which is generated when the valve armature shifts in response to the current being applied to the coil. A lack of detection of the deflection is indicative of a solenoid malfunction and causes generation of an alarm signal.

19 Claims, 5 Drawing Sheets

SOLENOID FAIL-SAFE USING CURRENT FEEDBACK AS A DIAGNOSTIC INPUT

CROSS REFERENCE TO RELATED APPLICATIONS

This application claims the benefit of U.S. Provisional Application No. 60/033,197, filed Dec. 18, 1996.

BACKGROUND OF THE INVENTION

This invention relates in general to electronic control units for anti-lock brake systems and in particular to a current feedback circuit and a method for monitoring operation of a solenoid valve in an anti-lock brake system.

An Anti-lock Brake System (ABS) is often included as standard or is optional equipment on new vehicles. When actuated, the ABS is operative to control the operation of some or all of the vehicle wheel brakes. A typical ABS includes a plurality of solenoid valves mounted within a control valve body and connected to the vehicle hydraulic brake system. Usually, a separate hydraulic source, such as a motor driven pump, is included in the ABS for reapplying hydraulic pressure to the controlled wheels during an ABS braking cycle. An ABS further includes an electronic control module which is electrically connected to the pump motor, a plurality of solenoid coils associated with the solenoid valves, and wheel speed sensors for monitoring the speed and deceleration of the controlled wheels. The electronic control module includes a microprocessor which is programmed to operate the ABS. The electronic control module is typically mounted upon the control valve body. The assembled valve body, motor and control module form a compact unit which is often referred to as an ABS control valve.

During vehicle operation, the ABS control module continuously receives wheel speed signals from the wheel speed sensors. The microprocessor in the control module monitors the wheel speed signals for potential wheel lock-up conditions. When the vehicle brakes are applied and the microprocessor senses an impending wheel lock-up condition, the microprocessor is operative to actuate the pump motor and selectively operate the solenoid valves in the control valve to cyclically relieve and reapply hydraulic pressure to the controlled wheel brakes. The hydraulic pressure applied to the controlled brakes is adjusted by the operation of the solenoid valves to limit wheel slippage to a safe level while continuing to produce adequate brake torque to decelerate the vehicle.

Proper operation of the solenoid valves in the ABS is not only required for controlling the braking of the vehicle, but safety aspects require disabling the ABS should a valve malfunction. Accordingly, it is known to include pressure sensors in the hydraulic brake lines to monitor operation of the solenoid valves. The pressure sensors are connected to the microprocessor in the ABS electronic control module. After the microprocessor causes a change in the operating condition of one of the solenoid valves, the microprocessor monitors the brake line pressure for a change in the hydraulic pressure resulting from the operation of the valve. If the change is not detected within a predetermined time period, the microprocessor deactivates the ABS and illuminates a warning light to alert the vehicle operator of an ABS malfunction.

SUMMARY OF THE INVENTION

This invention relates to a current feedback circuit and a method for monitoring the operation of a solenoid valve in an anti-lock brake system.

As described above, it is known to monitor brake fluid pressure with pressure sensors to determine whether the solenoid valves in an ABS are functioning properly. However, monitoring brake fluid pressure requires opening the hydraulic brake circuit for insertion of the pressure sensors. It would be desirable to determine if a solenoid valve in an ABS control module is malfunctioning without opening the hydraulic brake circuit.

The present invention contemplates a device for verifying the operation of a solenoid coil which has a sensor adapted to be coupled to a solenoid coil and a monitoring device connected to the sensor. The sensor is operable to generate a signal proportional to an electrical characteristic of the coil and the monitoring device is responsive to the sensor signal to generate an alarm signal. In the preferred embodiment, the electrical characteristic being sensed is the current flowing through the coil.

The monitoring device also is adapted to be coupled to the coil and is operable to measure the length of time that has elapsed since the coil has been energized. The monitoring device is operable to determine a change in the sensor signal and generate the alarm signal when the elapsed time has exceeded a predetermined time period and the change in the sensor signal is not less than a predetermined threshold.

In the preferred embodiment, the monitoring device includes a microprocessor and the sensor includes a sensing resistor adapted to be connected to the coil such that at least a portion of the coil current flows through the sensing resistor. The portion of the coil current causes a voltage to appear across the sensing resistor which is included in the sensing signal. It is further contemplated that the sensing resistor is included in a voltage divider and that the solenoid associated with the coil is included in a solenoid valve.

The solenoid valve can be included in an anti-lock brake system with the microprocessor being operative to deactivate the anti-lock brake system when the elapsed time has exceeded the predetermined time period and the change in the sensor signal is less than the predetermined threshold. Additionally, a warning device can be coupled to the microprocessor. The microprocessor is then operative to actuate the warning device when the elapsed time has exceeded the predetermined time period and the change in the sensor signal is less than the predetermined threshold. In the preferred embodiment, the warning device includes a warning lamp which is illuminated by the microprocessor.

The present invention also contemplates a method for monitoring the operation of a solenoid coil, the method including providing a device for monitoring an electrical characteristic of the solenoid coil. The electrical characteristic is monitored by the device for a change which is compared to a predetermined threshold. When the change in the electrical characteristic is not less than the predetermined threshold following the elapse of a predetermined time period, the monitoring device generates an alarm signal.

In the preferred embodiment, the electrical characteristic being monitored is the current flowing through the coil and the predetermined time period begins upon energization of the coil. It is further contemplated that the monitoring device includes a sensing resistor connected to the coil with at least a portion of the coil current flowing through the sensing resistor, the monitoring device being responsive to the voltage appearing across the sensing resistor to determine the change in the current flowing through the coil. In the preferred embodiment, the coil is included in a solenoid valve which is included in an anti-lock brake system, the monitoring device being operable upon generating an alarm signal to deactivate the anti-lock brake system.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
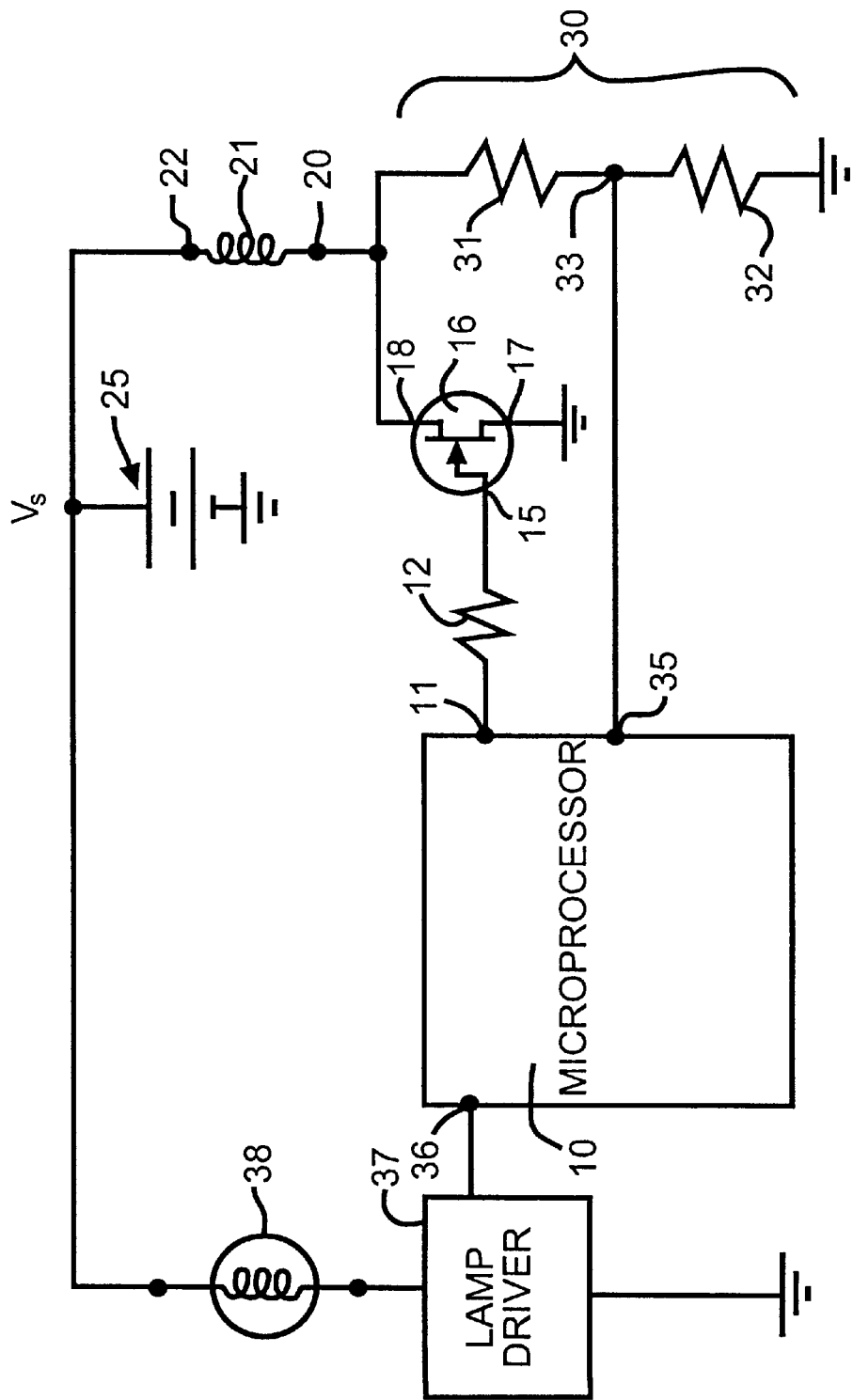
FIG. 1 is a circuit diagram of a portion of an ABS controller in accordance with the invention.

Referring now to the drawings, there is illustrated in FIG. 1 a schematic diagram of a portion of an ABS electronic control module circuit which includes a circuit for monitoring the operation of a solenoid valve. The control module includes a microprocessor 10 which monitors the speed of the controlled wheels and is operable, upon detecting an impending lock-up condition of a controlled wheel, to selectively actuate solenoid valves to preclude wheel lock-up. The microprocessor 10 includes an output port 11 which is connected through a resistor 12 to a gate terminal 15 of an n-channel FET 16. The FET 16 has a source terminal 17 connected to ground and a drain terminal 18 connected to a first end 20 of a coil 21 of a solenoid valve (not shown). The coil 21 has a second end 22 connected to a power supply 25, which, for simplicity, is shown as a vehicle storage battery in FIG. 1. The power supply 25 provides a voltage, $V_S$, to the circuit.

A voltage divider 30 is connected between the first end 20 of the solenoid coil 21 and ground. The voltage divider 30 includes a first current limiting resistor 31 connected in series to a second current sensing resistor 32. The two resistors 31 and 32 have a combined high resistance value such that only a very small steady state current, $I_{ss}$, will flow from the power supply 25 through the solenoid coil 21 and the resistors 31 and 32. The steady state current $I_{ss}$ is sufficiently small to have no effect upon the solenoid armature (not shown) associated with the coil 21.

The connection between the voltage divider resistors 31 and 32 defines a voltage tap 33. The voltage tap 33 is connected to an analog input port 35 on the microprocessor 10. As will be explained below, the microprocessor 10 monitors the voltage at the voltage tap 33 which is the voltage across the current sensing resistor 32. While only one solenoid coil 21 is shown in FIG. 1, it will be appreciated that a typical ABS controller includes a plurality of solenoid coils and that a similar circuit would be provided for each coil.

The microprocessor 10 also has an output port 36 which is connected to a conventional lamp driver 37. The lamp driver 37 is responsive to the potential at the output port 36 to switch between conducting and non-conducting states. The lamp driver 37 is connected between a first terminal of a warning lamp 38 and ground. In the preferred embodiment, the warning lamp 38 is mounted upon the vehicle dashboard. The warning lamp 38 has a second terminal which is connected to the power supply 25. When the ABS is functioning normally, the output port 36 of the microprocessor is at ground causing the lamp driver 37 to be in its non-conducting state. If the microprocessor determines that the ABS is malfunctioning, the output port 36 goes high, causing the lamp driver 37 to be switch to its conducting state and illuminate the warning lamp 38.

Figure 2:
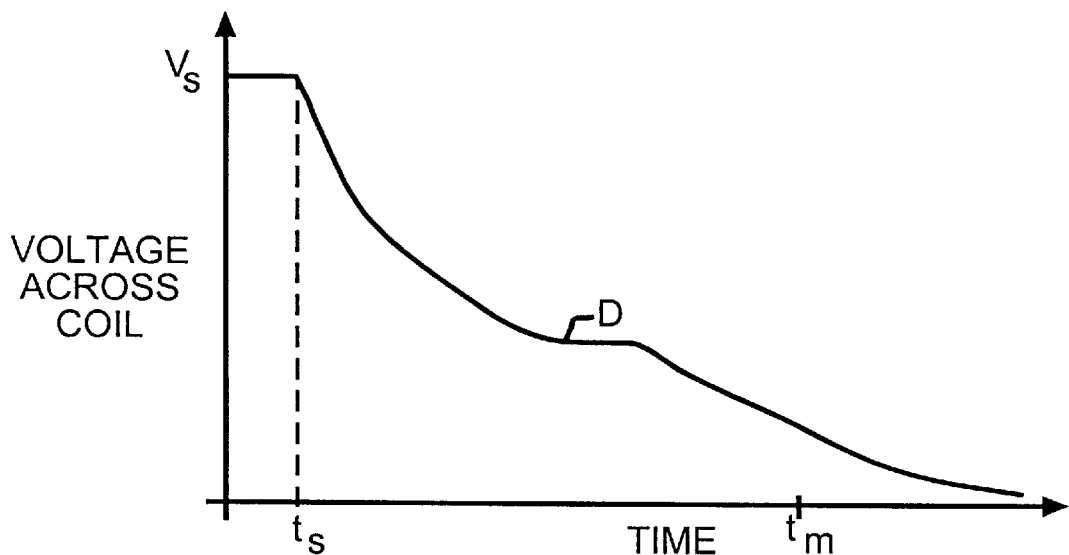
FIG. 2 is a graph of voltage across the coil shown in FIG. 1 as a function of time when the solenoid valve associated with the coil is functioning properly.
Figure 3:
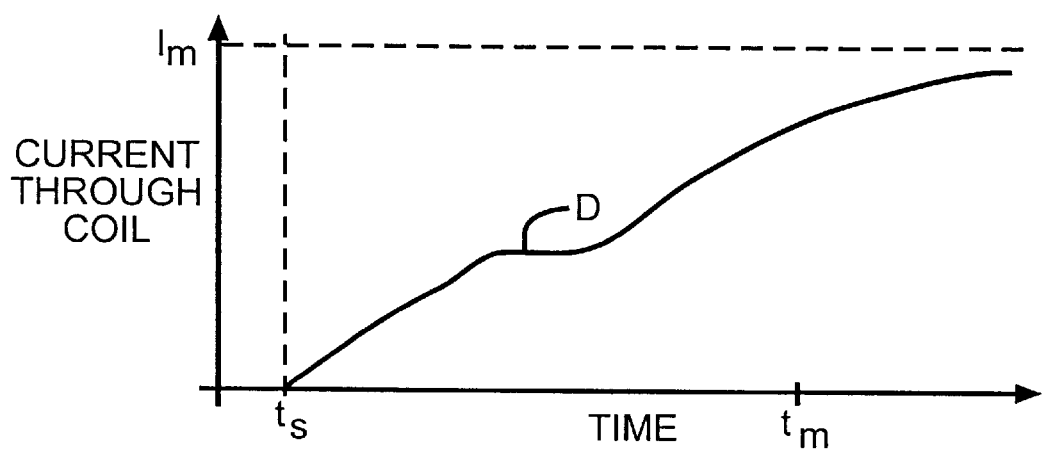
FIG. 3 is a graph of current through the coil shown in FIG. 1 as a function of time which corresponds to the voltage shown in FIG. 2.
Figure 4:
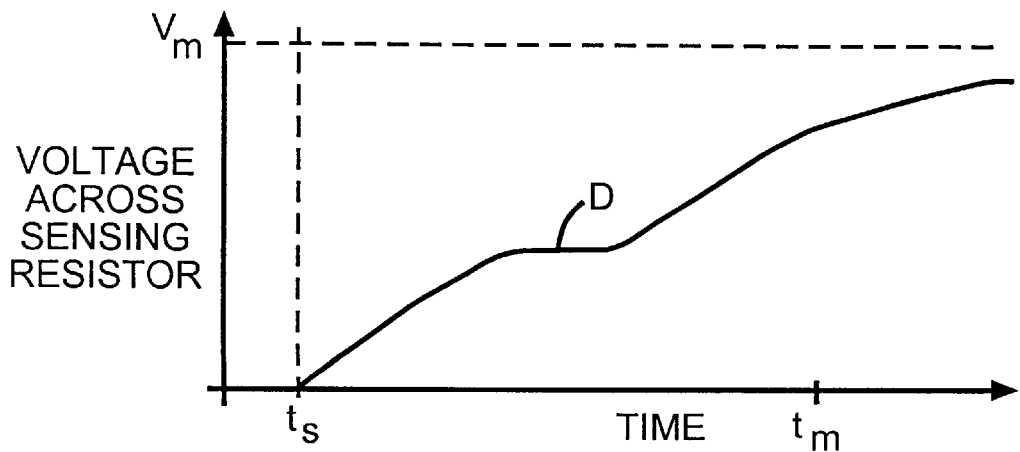
FIG. 4 is a graph of voltage across the sensing resistor shown in FIG. 1 as a function of time which corresponds to the current shown in FIG. 3.

The operation of the solenoid monitoring circuit will now be explained. During operation of the ABS, when the microprocessor 10 docs not require actuation of the solenoid valve associated with the coil 21, the microprocessor output pin 11 is held at ground. This pulls the FET gate terminal 15 to ground, causing the FET 16 to be in a non-conducting state which limits current flow through the solenoid coil 21 to the small steady state value $I_{ss}$ as determined by the total resistance of the voltage divider 30. With essentially no current flowing through the coil 21 and the voltage divider 30, approximately the full voltage $V_s$ of the supply 25 will appear across the coil 21, as shown in FIG. 2 where the voltage across the coil 21 is shown as a function of time. The corresponding current through the coil 21 as a function of time is illustrated in FIG. 3 while the voltage across the current sensing resistor 32 as a function of time is shown in FIG. 4.

At time $t_s$, the microprocessor 10 requires that the solenoid valve be actuated. Accordingly, the microprocessor output pin 11 goes "high" to apply a positive voltage to the FET gate terminal 15. This switches the FET 16 to a conducting state, allowing current to flow from the power supply 25 through the solenoid coil 21 to ground. The current flowing thorough the coil 21 generates a magnetic field which causes the valve armature to shift axially to actuate the associated solenoid valve. A portion of the current flowing through the coil 21 flows through the voltage divider 30. Accordingly, a voltage appears across the sensing resistor 32 which is proportional to the current through the coil 21. As the current in the coil 21 increases, the voltage across the voltage divider 30 increases. Thus, the voltage appearing across the current sensing resistor 32 and the associated voltage applied to the analog port 35 of the microprocessor 10 is directly proportional to the current flowing through the solenoid coil 21. The inductance of the coil 21 limits the rates at which the current through the coil 21 and the associated voltage across the current sensing resistor 32 increase.

As described above, as current flows through the coil 21, a magnetic field is established within the associated solenoid valve. As the current increases, the magnetic field becomes stronger, until the solenoid valve armature (not shown) shifts. The movement of the solenoid armature generates a back electro-motive force (emf) in the coil 21. The back emf partially counters the current flowing through the coil 21. This causes a momentary disruption in the current flow, which appears as a deflection on the graphs of current and voltage vs. time shown in FIGS. 2 through 4. Depending upon the physical characteristics of the solenoid valve, an inflection point may occur upon the curve. The current disruption extends for a period of time and results in the flat portion labeled "D" in FIGS. 2 through 4. Once the valve is actuated, the armature movement stops and the back emf decays to zero. Without the back emf, the current through the coil 21 resumes increasing with a corresponding increase in the voltage across the sensing resistor 32. The current through the coil 21 is limited to a maximum value, $I_m$, by the resistance present in the circuit.

Figure 5:
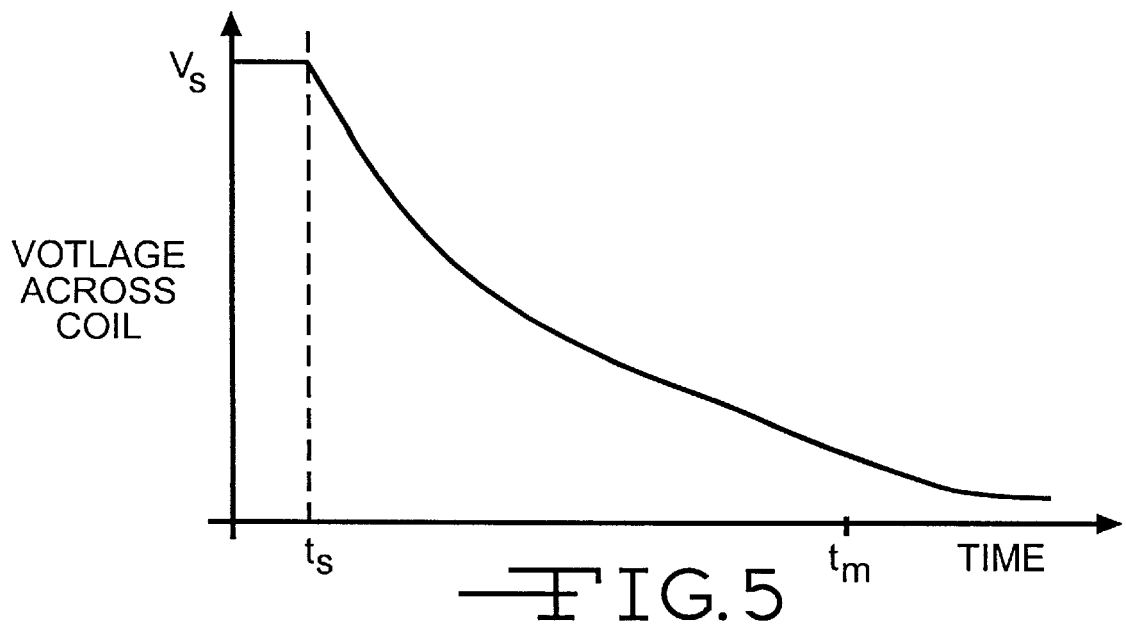
FIG. 5 is a graph of voltage across the coil shown in FIG. 1 as a function of time when the solenoid valve associated with the coil is not functioning properly.
Figure 6:
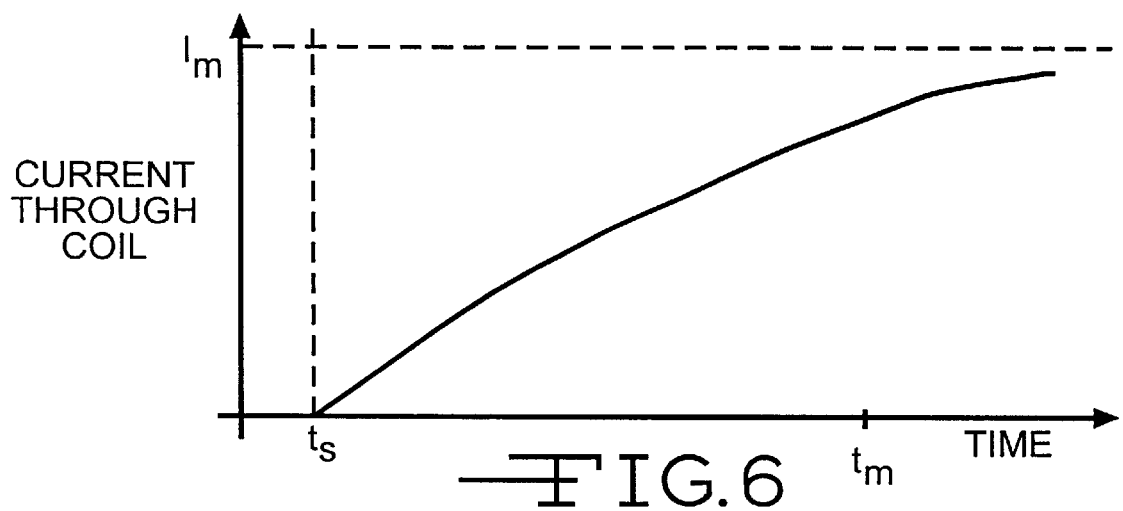
FIG. 6 is a graph of current through the coil shown in FIG. 1 as a function of time which corresponds to the voltage shown in FIG. 5.
Figure 7:
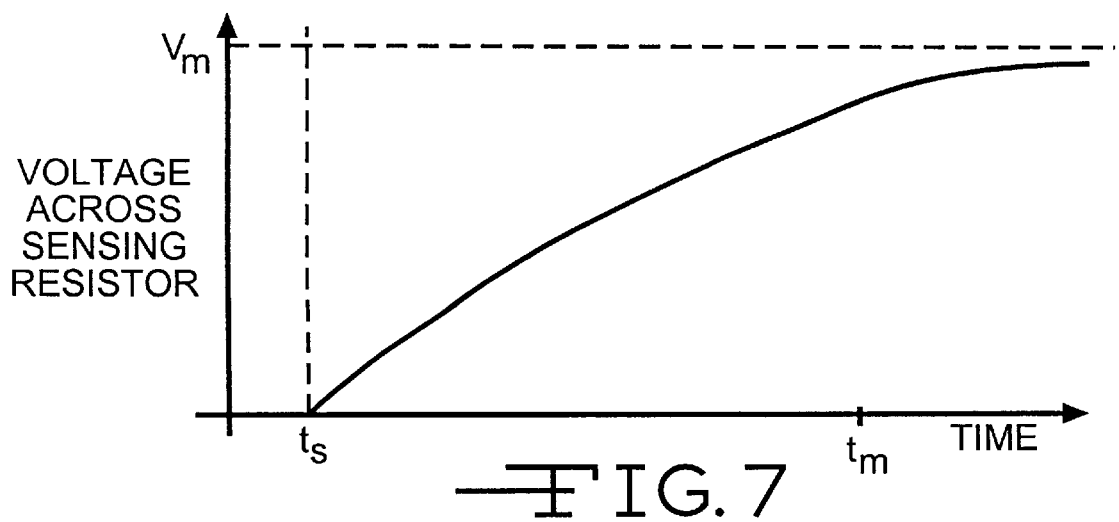
FIG. 7 is a graph of voltage across the sensing resistor shown in FIG. 1 as a function of time which corresponds to the current shown in FIG. 6.

If the solenoid valve is malfunctioning, the armature in the solenoid valve associated with the energized coil 21 will not move in response to the magnetic field generated by current flowing through the coil 21. Without movement of the armature, the graph of voltage across the coil 21 as a function of time would appear as a continuously decreasing curve without a deflection, as shown in FIG. 5. Corresponding graphs of current though the coil 21 and voltage across the sensing resistor 32 are shown in FIGS. 6 and 7, respectively.

The present invention contemplates that the microprocessor 10 verifies that the solenoid valve is functioning by monitoring the voltage at the current sensing port 35 for the deflection. The microprocessor is programmed to detect the occurrence of the current deflection, within a predetermined time period after the microprocessor output pin 11 is set high to switch the FET 16 to its conducting state. In FIGS. 2 through 4, the predetermined time period extends from $t_s$ to $t_m$. If the deflection is not detected by $t_m$, the microprocessor 10 is responsive to shut down the ABS and illuminate the warning lamp 38.

While the preferred embodiment of the invention has been illustrated and described as being operative upon determining that a deflection in the coil current response curve has occurred, it will be appreciated that, when the solenoid valve characteristics cause generation of an inflection point, the invention also may be practiced by detecting the occurrence of the inflection point.

Figure 8:
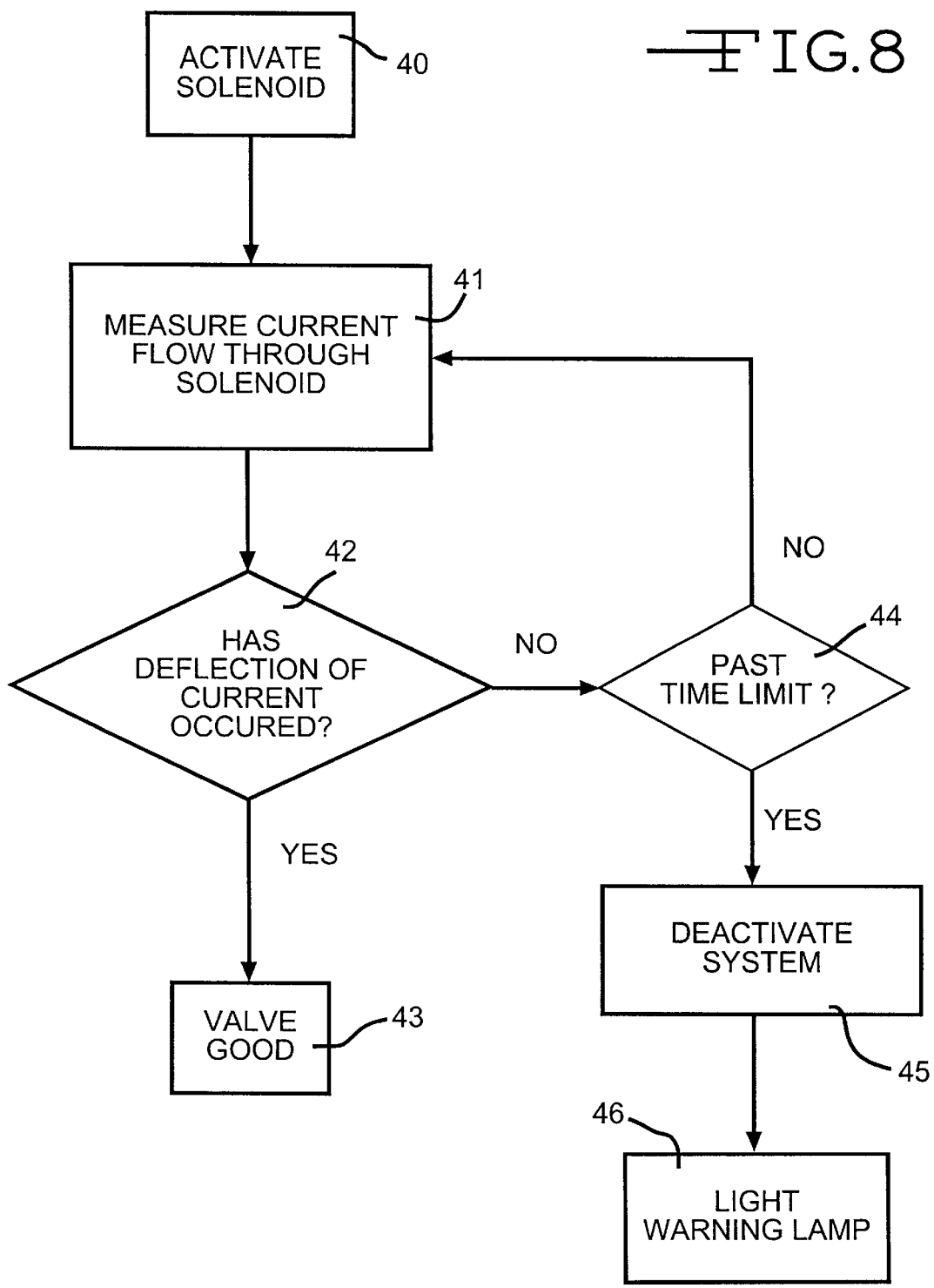
FIG. 8 is a flow chart for a diagnostic subroutine in accordance with the invention.

A flow chart of a subroutine for monitoring the operation of a solenoid valve as described above is shown in FIG. 8. In functional block 40, the FET 16 is switched to its conducting state to energize the solenoid coil 21. In functional block 41, the current through the coil 21 is measured by monitoring the voltage across the current sensing resistor 32 in the voltage divider 30. In decision block 42, the monitored current is checked for the detection of a deflection in the coil current response curve. If a deflection is detected, the valve is functioning properly and the subroutine is terminated by transferring to functional block 43.

If the deflection is not detected in decision block 42, the subroutine transfers to decision block 44 and a counter driven by the microprocessor clock is checked to determine if a sufficient period of time has elapsed for the solenoid armature to move and generate an inflection point. If there has not been a sufficient elapse of time, the subroutine returns to functional block 41 and measures the current flow again. If, on the other hand, there has been a sufficient elapse of time, the lack of detection of a deflection in the coil current response curve is indicative that the solenoid valve has malfunctioned and the subroutine transfers to functional block 45 to deactivate the ABS. Upon deactivation, the subroutine continues to functional block 46 to illuminate a warning light to signal the vehicle operator that the ABS has malfunctioned and been deactivated.

As explained above, the invention can also be practiced, if appropriate for the specific solenoid valve, by detecting an inflection point in the coil current response curve. To do so, the rate of change of current would be determined in functional block 41 in FIG. 8. The rate of change would then be compared to zero in decision block 42 with transfer of the subroutine to functional block 44 if the rate of change is grater than zero and to functional block 43 if the rate of change is equal to or less than zero. Additionally, the invention also can be practiced by comparing the rate of change to a nonzero threshold value with transfer to functional block 44 if the rate is greater than the threshold and to functional block 43 if the rate is less than or equal to the threshold.

A flow chart illustrating one method of implementing the subroutine described above is shown in FIG. 9. In functional block 50, the solenoid valve is actuated. The voltage, $V_R$, across the sensing resistor 32 is measured in functional block 51 as V(N). A counter, N, is indexed to N+1 in functional block 52 by the microprocessor clock after a predetermined time has elapsed. The voltage across the sensing resistor 32 is measured again in functional block 53 as V(N+1). In functional block 54, the change in voltage, DV, across the sensing resistor 32 is calculated by subtracting V(N) from V(N+1).

In decision block 55, the change in voltage DV is compared to a threshold value VL. If a deflection in the coil current response curve has occurred due to movement of the armature, the change in voltage will be less than the threshold value VL. Accordingly, if the DV is less than VL, the valve is determined to be functioning properly and the subroutine transfers to functional block 56. The counter N is reset to zero in functional block 57 and the subroutine transfers back to the main program.

If the change in voltage DV is greater than or equal to the threshold voltage VL, the subroutine transfers to decision block 58. In decision block 58 the counter N is compared to a time threshold TM to determine if the time period shown as $t_s-t_m$ in FIGS. 2 through 7 has elapsed. If the time period has not elapsed, the subroutine transfers to functional block 59 where the first voltage value measured V(N) is set equal to the second voltage value measure V(N+1). The subroutine then returns to functional block 52 for indexing of the counter and measurement of another voltage across the sensing resistor 32. The loop then repeats.

If the time period has elapsed in decision block 58 then both criteria for detecting a malfunctioning valve have been met; that is, a deflection has not been detected and the time period for the valve responding has expired. Accordingly, the subroutine resets the counter in functional block 60 and then deactivates the ABS system in functional block 61. Finally, the subroutine causes the warning lamp 38 to be illuminated in functional block 62.

Figure 9:
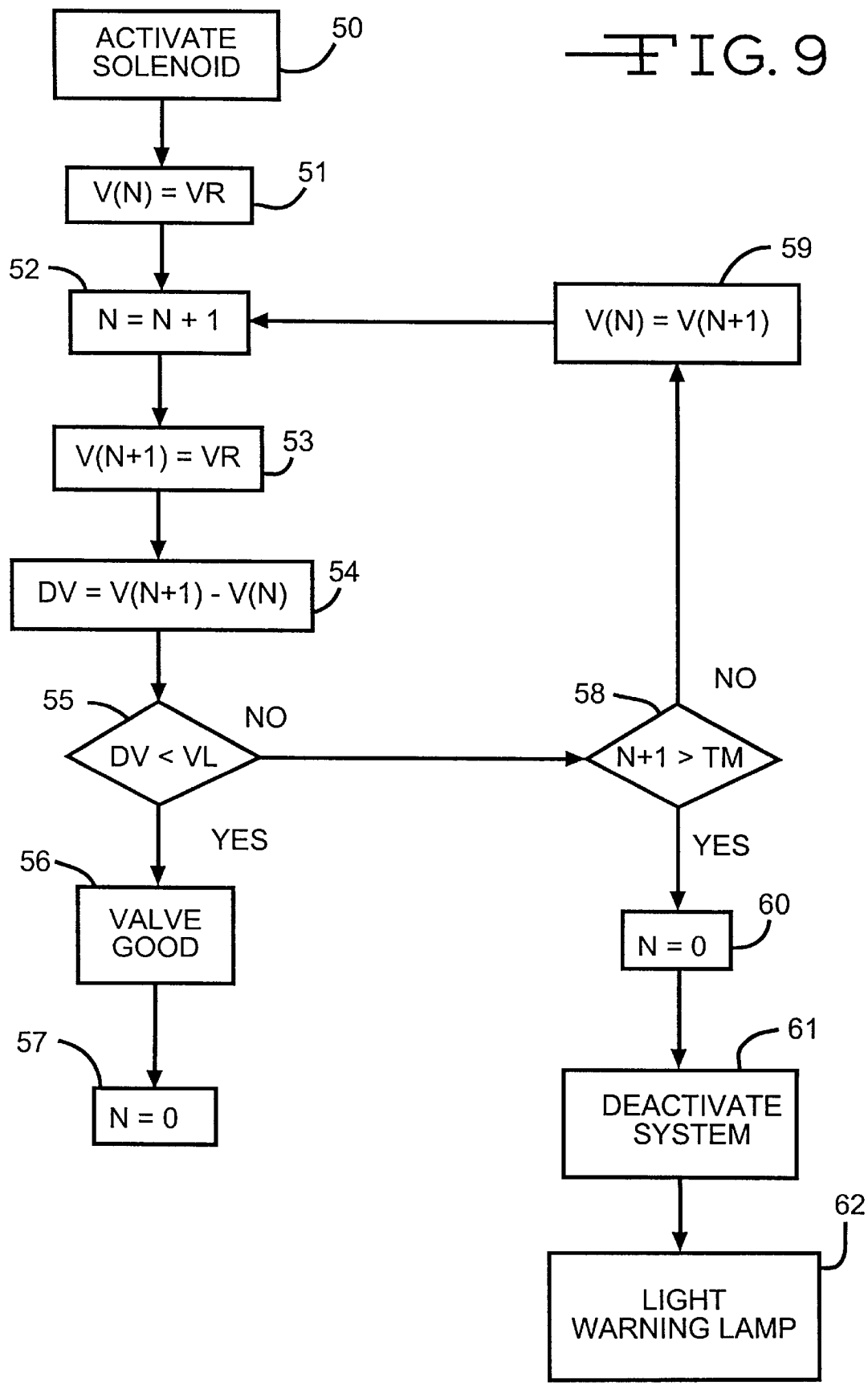
FIG. 9 is flow chart illustrating a method of implementing the subroutine shown in FIG. 8.

The flow chart shown in FIG. 9 is intended to be illustrative. It will be appreciated that the invention can be practiced with logic other than illustrated in FIG. 9. For example, the inflection point can be determined by means of a calculation of the slope of the voltage curve for the sensing resistor 32 shown in FIG. 4. Since the voltage curve for the sensing resistor 32 is proportional to the current flowing through the coil 21, slope of the voltage curve will correspond to the slope of the current curve shown in FIG. 2. The slope of the voltage curve can be calculated by dividing the change in voltage DV by the sampling time period. If the calculated slope is less than a predetermined threshold value, the microprocessor 10 would determine that a deflection point has been reached.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope. For example, while the invention has been described and illustrated as monitoring the operation of a solenoid valve in an anti-lock brake system, it will be appreciated that the invention can be used to monitor operation of solenoid valves in other devices, such as, for example, traction control, vehicle stability and engine fuel management systems. Additionally, the invention can be practiced to monitor the operation of solenoid activated devices in general, since all solenoids include an axially shiftable armature.

What is claimed is:

1. A device for verifying the operation of a solenoid valve coil included in an anti-lock bake system, the device comprising:

a sensor adapted to be coupled to the solenoid valve coil, said sensor operable to generate a signal proportional to an electrical characteristic of the coil; and a monitoring device connected to said sensor and the anti-lock brake system, said monitoring device responsive to said sensor signal to generate an alarm signal, said monitoring device being operable to measure the length of time that has elapsed since the solenoid valve coil has been energized and also to monitor a rate of change of said sensor signal during a predetermined time period, said monitoring device being further operable to generate said alarm signal and deactivate the anti-lock brake system when said elapsed time has exceeded said predetermined time period and said rate of change of said sensor signal has been greater than a predetermined threshold throughout said predetermined time period.

2. A device according to claim 1 wherein said sensor signal is proportional to a current flowing through said coil.

3. A device according to claim 2 wherein said monitoring device includes a microprocessor.

4. A device according to claim 3 wherein said microprocessor is included in the anti-lock brake system.

5. A device according to claim 3 wherein said sensor includes a sensing resistor adapted to be connected to the coil and further wherein at least a portion of said coil current flows through said sensing resistor to cause a voltage to appear across said sensing resistor and further wherein said sensing signal includes said voltage appearing across said sensing resistor.

6. A device according to claim 5 wherein said sensing resistor is included in a voltage divider.

7. A device according to claim 6 wherein said microprocessor is operative to calculate said rate of change of said sensor signal during said predetermined time period.

8. A device according to claim 7 further including a warning device coupled to said microprocessor with said microprocessor being operative when said elapsed time has exceeded said predetermined time period and said rate of change of said sensor signal has been greater than said predetermined threshold to actuate said warning device.

9. A device according to claim 8 wherein said warning device includes a warning lamp and said microprocessor is responsive when said elapsed time has exceeded said predetermined time period and said rate of change of said sensor signal has been greater than said predetermined threshold to illuminate said warning lamp.

10. A method for monitoring the operation of a solenoid valve coil included in an anti-lock brake system, the method comprising the steps of:

(a) providing a device for monitoring an electrical characteristic of the solenoid coil, the device being connected to the anti-lock brake system;

(b) monitoring the electrical characteristic with the monitoring device for a change, the monitoring device determining the rate of change of said electrical characteristic during a predetermined time period and comparing the rate of change to a predetermined threshold; and (c) generating an alarm signal and deactivating the anti-lock brake system when the rate of change of the electrical characteristic has been greater than the predetermined threshold throughout the predetermined time period.

11. A method according to claim 10 wherein the electrical characteristic being monitored in step (b) is the current flowing through the coil and further wherein the predetermined time period begins upon energization of the coil.

12. A method according to claim 11 wherein the monitoring device provided in step (a) includes a sensing resistor connected to the coil with at least a portion of the coil current flowing through the sensing resistor and further wherein the monitoring device is responsive to the voltage appearing across the sensing resistor to determine the change in the current flowing through the coil.

13. A method according to claim 12 wherein the sensing resistor is included in a voltage divider which is connected to the coil.

14. A method according to claim 13 wherein the monitoring device includes a microprocessor and further wherein the microprocessor is operative during step (b) to calculate the rate of change of the sensor signal.

15. A method according to claim 14 wherein the monitoring device also includes an alarm which is actuated upon generation of the alarm signal.

16. A method according to claim 15 wherein the alarm includes a warning lamp which is illuminated upon generation of the alarm signal.

17. A method according to claim 14 wherein the microprocessor is included in the anti-lock brake system.

18. A device for verifying the operation of a solenoid valve coil included in a traction control system, the device comprising:

a sensor adapted to be coupled to the solenoid valve coil, said sensor operable to generate a signal proportional to an electrical characteristic of the coil; and a monitoring device connected to said sensor and the traction control system, said monitoring device responsive to said sensor signal to generate an alarm signal, said monitoring device being operable to measure the length of time that has elapsed since the solenoid valve coil has been energized and also to monitor a rate of change of said sensor signal during a predetermined time period, said monitoring device being further operable to generate said alarm signal and deactivate the traction control system when said elapsed time has exceeded said predetermined time period and said rate of change of said sensor signal has been greater than a predetermined threshold throughout said predetermined time period.

19. A device for verifying the operation of a solenoid valve coil included in a vehicle stability control system, the device comprising:

a sensor adapted to be coupled to the solenoid valve coil, said sensor operable to generate a signal proportional to an electrical characteristic of the coil; and a monitoring device connected to said sensor and the vehicle stability control system, said monitoring device responsive to said sensor signal to generate an alarm signal, said monitoring device being operable to measure the length of time that has elapsed since the solenoid valve coil has been energized and also to monitor a rate of change of said sensor signal during a predetermined time period, said monitoring device being further operable to generate said alarm signal and deactivate the vehicle stability control system when said elapsed time has exceeded said predetermined time period and said rate of change of said sensor signal has been greater than a predetermined threshold throughout said predetermined time period.

* * * * *